US005524766A

United States Patent [19]
Marchek et al.

[11] Patent Number: 5,524,766
[45] Date of Patent: Jun. 11, 1996

[54] PACKAGING SYSTEM FOR STORING AND HANDLING ELECTRICAL CONNECTOR COMPONENTS WITHIN STORAGE TUBES

[75] Inventors: Kyle J. Marchek, Greer, S.C.; Timothy R. McClelland, Bolingbrook, Ill.

[73] Assignee: Molex Incorporated, Lisle, Ill.

[21] Appl. No.: 495,252

[22] Filed: Jun. 27, 1995

[51] Int. Cl.$^6$ ................................................. B65D 73/02
[52] U.S. Cl. ............................................ 206/718; 206/701
[58] Field of Search ..................................... 206/701, 713, 206/718, 723, 722, 725, 499

[56] References Cited

U.S. PATENT DOCUMENTS

| | | | |
|---|---|---|---|
| 3,454,154 | 7/1969 | Peters et al. | 206/718 |
| 4,764,079 | 8/1988 | Linker et al. | 414/411 |
| 4,899,876 | 2/1990 | Murphy et al. | 206/334 |
| 5,012,925 | 5/1991 | Gallagher, Sr. | 206/718 |
| 5,279,415 | 1/1994 | Edgley et al. | 206/328 |
| 5,348,150 | 9/1994 | Brenner et al. | 206/718 |
| 5,436,446 | 7/1995 | Hosseinmardi et al. | 206/718 |

*Primary Examiner*—David I. Fidei
*Attorney, Agent, or Firm*—A. A. Tirva

[57] ABSTRACT

A packaging system is disclosed for storing and handling electrical connector components and the like. The system employs a plurality of elongated component-containing tubes. Each tube has an aperture near at least one end thereof. An assembly rod passes through aligned apertures of a plurality of generally parallel juxtaposed tubes to hold the tubes in a generally stacked array. A stopper plug is adapted for insertion into the one end of each tube to retain the components therein. The assembly rod interengages each stopper plug, whereby all of the stopper plugs are held in their respective tubes by the assembly rod, and removal of the rod from the tubes pulls the stopper plugs out of the one ends of the tubes.

11 Claims, 3 Drawing Sheets

PACKAGING SYSTEM FOR STORING AND HANDLING ELECTRICAL CONNECTOR COMPONENTS WITHIN STORAGE TUBES

FIELD OF THE INVENTION

This invention generally relates to the art of electrical connectors and, particularly, to a packaging system for storing and handling electrical connector components, or the like, by employing elongated component-containing storage tubes.

BACKGROUND OF THE INVENTION

During the manufacture of electrical connectors, integrated circuits and other electrical or electronic devices, the devices are stored in and transferred to and from various types of equipment for carrying out different manufacturing or assembling steps. For instance, the devices may be assembled, tested, inspected, and the like, during which the devices are stored, protected and handled in protective storage tubes between various manufacturing processes or machines. Most such tubes are fabricated of extruded plastic material, but the tubes may be made of metal or other appropriate material. A "rack" of the tubes may be loaded into a "magazine" of an assembly machine, with the devices being dispensed seriatim from each individual tube, whereafter the tube is discarded for dispensing devices from the successive tube in the rack.

As an example, only, such storage tubes may hold as many as twenty-five or more electrical devices for handling during manufacture. When processing is complete, the devices also may be shipped to customers in the tubes. A very large electronic manufacturer may process thousands and thousands of electronic devices in any given lot. For every one-thousand electronic devices, forty storage tubes are used. A plurality of the tubes normally are stored in a bulk container or tote box which is transferred, along with the related paperwork, between separate manufacturing processes or to the customer.

Heretofore, after the electronic devices have been completely processed or finally used by a customer, the storage tubes have been discarded. In other words, the tubes have been considered as disposable items. However, with ever-increasing manufacturing volume, and with ever-increasing environmental considerations, it has become expedient to reuse or recycle such storage tubes.

Heretofore, one packaging system has utilized a pair of elongated stop rods for holding the electronic devices in their respective tubes, and to hold a plurality of the tubes for conjoint manual manipulation. More particularly, each tube is provided with an aperture therethrough near each opposite end thereof. When a "rack" of tubes are assembled with a plurality of tubes in a generally parallel juxtaposition, the stop rods are inserted through the aligned apertures of all of the tubes in the rack to close-off the ends of the tubes and to allow for manual handling of an entire rack of tubes interconnected by the rods.

The stop rods have proven effective for holding the electronic devices in their respective tubes in many applications. However, in some applications, particularly when the tubes contain delicate electronic components (e.g. ferrite cores), it is desirable to prevent any movement between the components within the tubes. The elongated stop rods, alone, cannot prevent such movement, and the delicate electronic components can be damaged during handling of the tubes. In order to solve these problems, other packaging systems have employed stopper plugs insertable into one end of each storage tube to push all of the components toward the other end of the tube and, thereby, prevent any movement therebetween. A problem with such systems that employ stopper plugs is that once the rack of tubes arrives at the assembly point, each stopper plug must be removed individually from each storage tube and this requires unnecessary time and effort. In fact, an individual stopper plug can get stuck within its respective tube and cause more delays in the processing procedures.

The present invention is directed to solving the problems outlined above by a packaging system which uses both stop rods and stopper plugs in a unique arrangement.

SUMMARY OF THE INVENTION

An object, therefore, of the invention is to provide a new and improved packaging system for storing and handling electrical connector components, or the like, particularly a system employing a plurality of elongated component-containing tubes.

In the exemplary embodiment of the invention, the packaging system employs a plurality of elongated component-containing tubes wherein each tube has an aperture near at least one end thereof. An assembly rod is adapted for passing through aligned apertures of a plurality of generally parallel juxtaposed tubes to hold the tubes in a generally stacked array. A stopper plug is adapted for insertion into the one end of each tube to retain the components therein. Generally, complementary interengaging holding means are provided between the assembly rod and each stopper plug, whereby all of the stopper plugs are held in their respective tubes by the assembly rod, and removal of the rod from the tubes releases the stopper plugs for their removal from the tubes.

In particular, the holding means comprise an aperture in each stopper plug through which the assembly rod passes to hold the stopper plugs in the tubes. The stopper plugs are resilient for applying biasing pressure against the end-most components in the tubes.

The invention particularly contemplates that the apertures in the tubes be open toward the one ends of the tubes. Therefore, the assembly rod can be moved out of the apertures lengthwise of the tubes, transversely of the assembly rod, and effectively pull the stopper plugs therewith out of the one ends of the tubes. Therefore, all of the stopper plugs can be pulled out of their tubes simultaneously in one action by the assembly rod, itself.

Lastly, the open apertures in the tubes are sized and configured to maintain the assembly rod therewithin unless forcibly removed therefrom. In the preferred embodiment of the invention, the open apertures are generally key-hole shaped to define hole portions, mouth portions and restricted portions therebetween. The hole portions are sized slightly larger than the diameter of the assembly rod, and the restricted portions are sized slightly smaller than the diameter of the rod but allowing the rod to pass thereby outwardly of the tube through the mouth portions of the apertures.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
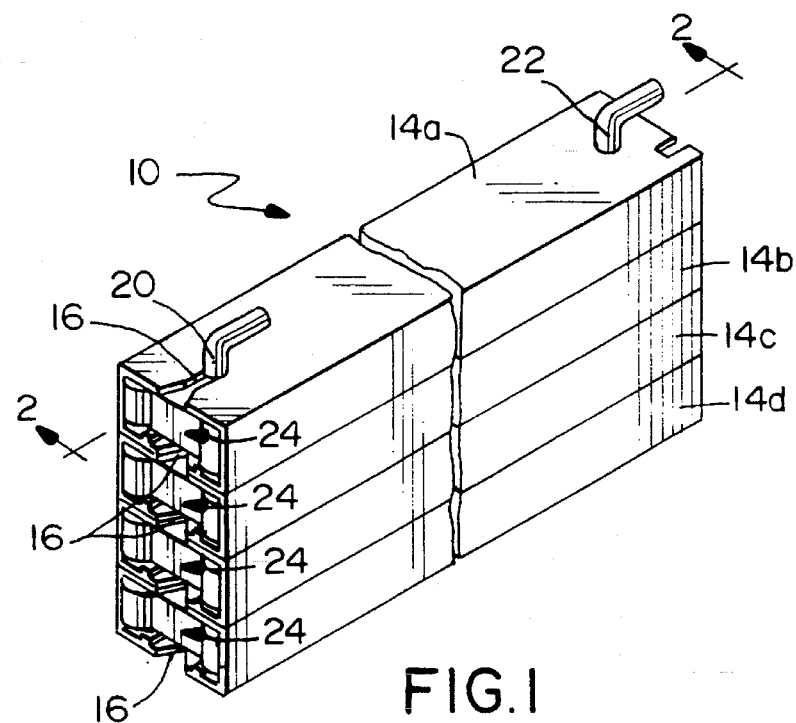
FIG. 1 is a fragmented perspective view of a rack of storage tubes held together by a pair of assembly rods, one rod holding the stopper plugs within the tubes according to the invention.
Figure 2:
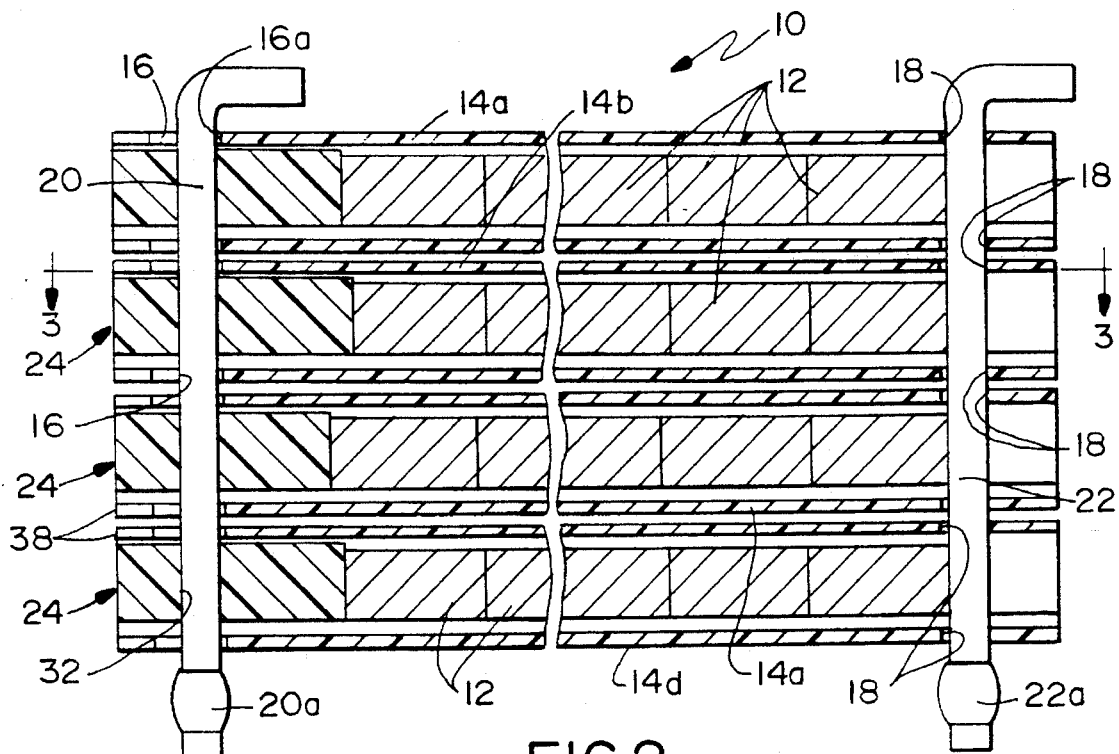
FIG. 2 is a fragmented vertical section, on an enlarged scale, taken generally along line 2—2 of FIG. 1.
Figure 3:
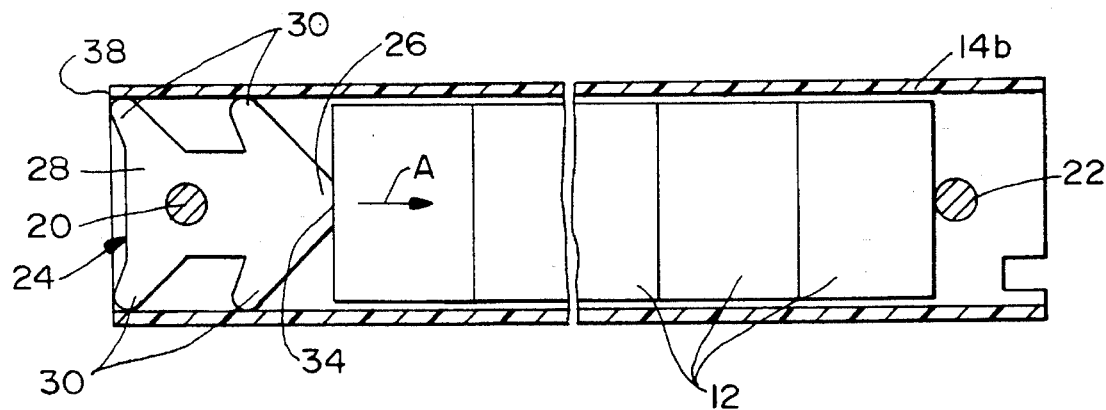
FIG. 3 is a fragmented horizontal section taken generally along line 3—3 of FIG. 2.

Referring to the drawings in greater detail, and first to FIGS. 1–3, a packaging system embodying the concepts of the invention is generally designated 10. The system is designed for storing and handling electrical connector components 12 (FIGS. 2 and 3) in an end-to-end or side-by-side array in each of a plurality of elongated component containing tubes 14a–14d. Each tube has an aperture 16 at one end and an aperture 18 at the opposite end for receiving a pair of assembly rods 20 and 22. The storage tubes can be fabricated of a variety of materials, but preferably the tubes are extruded of thin plastic material. In essence, the tubes are held in a "rack" by assembly rods 20 and 22 which pass through aligned apertures 16 and 18 of a plurality of generally parallel juxtaposed tubes as shown in FIGS. 1 and 2. Each assembly rod has a slightly enlarged bulb portion 20a and 22a which are forced through apertures 16 and 18 and, thereby, prevent the rods from being accidentally lifted out of the rack of tubes.

Figure 4:
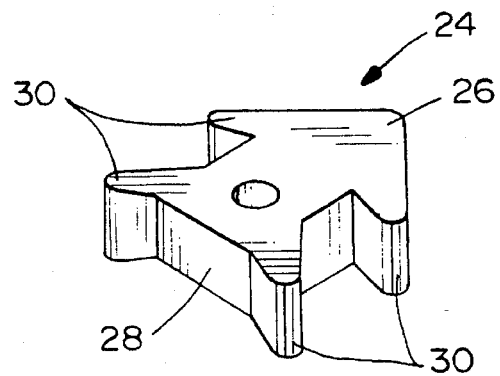
FIG. 4 is a perspective view of one of the stopper plugs.

Referring to FIG. 4 in conjunction with FIGS. 1–3, a stopper plug, generally designated 24, is inserted into one end of each storage tube 14a–14d to retain components 12 therewithin and to take up any slack between the components to prevent movement of the components relative to each other which might damage the components during handling and shipping. More particularly, each stopper plug 24 includes an insertion end 26 and a rear end 28, with a pair of flexible side wings 30 on each side of the plug between the insertion and rear ends thereof. A through hole 32 is formed in each plug for passing therethrough of assembly rod 20 as shown best in FIG. 2. Preferably, stopper plugs 24 are fabricated of resilient material for applying biasing pressure against the end-most component in the tubes. For instance, it can be seen in FIG. 3 that the insertion end 26 of the stopper plug 24 shown therein, is slightly crushed or indented, as at 34, whereby the inherent resiliency of the plug applies a pressure on connector components 12 in the direction of arrow "A".

Figure 5:
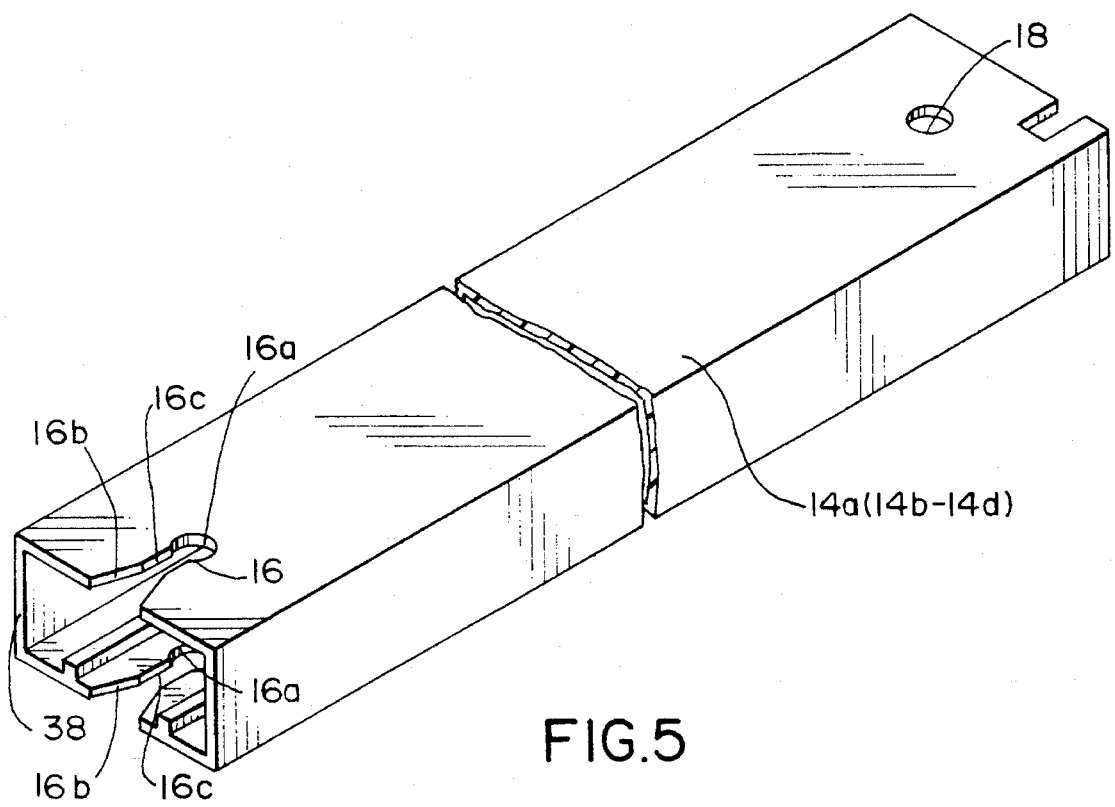
FIG. 5 is a fragmented perspective view of one of the storage tubes.

Referring to FIG. 5 in conjunction with FIGS. 1 and 2, it can be seen that each aperture 18 in each tube 14a–14d is simply a round hole in the top and bottom of the tube for receiving assembly rod 22 (FIG. 2) therethrough. However, aperture 16 in the bottom and top of each tube is generally open toward the one end 38 of the tube. This allows assembly rod 20 to be moved out of the apertures lengthwise of the tubes, transversely of the rod, and to pull stopper plugs 24 therewith out of ends 38 of the tubes.

Preferably, apertures 16 are key-hole shaped to define hole portions 16a, mouth portions 16b and restricted portions 16c. Hole portions 16a are sized slightly larger than the diameter of assembly rod 20 simply to allow the rod to be inserted freely therein without binding but to secure the rod within the hole portions. Restricted portions 16c of key-hole shaped apertures 16 are slightly smaller than the diameter of assembly rod 20 to allow the rod to pass by the restricted portions but to maintain the rod in hole portions 16a, sort of by a "snapping" action. Mouth portions 16b of the key-hole shaped apertures 16 are outwardly flared to freely guide assembly rod 20 into and out of the apertures.

FIGS. 1–3 show all of storage tubes 14a–14d fully loaded with electrical connector components 12, and with the storage tubes in a "rack" thereof held in assembled condition by assembly rods 20 and 22. Stopper plugs 24 are inserted into ends 38 of the storage tubes and are held therewithin by assembly rod 20. The stopper plugs bias components 12 toward assembly rod 22 to take up any slack or movement between the components.

Figure 6:
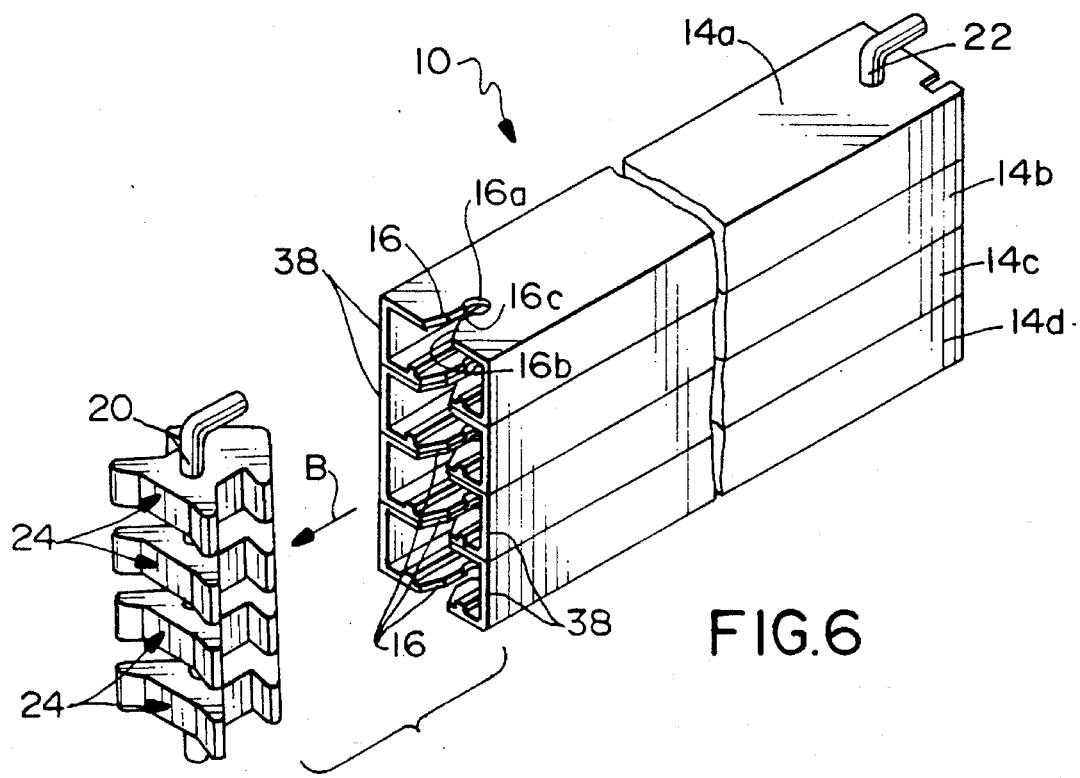
FIG. 6 is a perspective view similar to that of FIG. 1, but showing the one assembly rod having been removed longitudinally of the rack of storage tubes, pulling all of the stopper plugs therewith out of the tubes.

When the rack of loaded and assembled storage tubes 14a–14d (FIGS. 1–3) arrive at an assembly point of a manufacturing or assembly machine, reference is made to FIG. 6 wherein it can be seen that assembly rod 20 has been moved out of apertures 16 at ends 38 of the storage tubes in the direction of arrow "B". In other words, rather than pulling assembly rod 20 longitudinally out of apertures 16 transversely of the storage tubes, the rod is moved in the direction of arrow "B" lengthwise of the tubes, transversely of the rod, to pull stopper plugs 24 with the rod simultaneously in one action. All of storage tubes 14a–14d now are open-ended as shown in FIG. 6, ready for use at the assembly station.

It should be understood that the use of the term electrical connector "components" to define elements 12 in the drawings is not to be intended as limiting herein or in the claims hereof. Elements 12 can be a wide variety of electrical or electronic devices, ranging from fully assembled connectors to connector components to integrated circuits, ferrite blocks and the like. Packaging systems employing storage tubes such as tubes 14a–14d have a wide variety of applications.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A packaging system for storing and handling electrical connector components, comprising:

a plurality of elongated component-containing tubes, each tube having an aperture near at least one end thereof;

an assembly rod adapted for passing through aligned apertures of a plurality of generally parallel juxtaposed tubes to hold the tubes in a generally stacked array;

a stopper plug adapted for insertion into said one end of each tube to retain the components therein; and complementary interengaging holding means between the assembly rod and each stopper plug whereby all of the stopper plugs are held in their respective tubes by the assembly rod and removal of the rod from the tubes releases the stopper plugs for their removal from the tubes.

2. The packaging system of claim 1 wherein said holding means comprise a hole in each stopper plug through which the assembly rod passes to hold the stopper plugs in the tubes.

3. The packaging system of claim 1 wherein said stopper plugs are resilient for applying biasing pressure against the end-most components in the tubes.

4. The packaging system of claim 1 wherein said apertures are open toward said one ends of the tubes whereby the assembly rod can be moved out of the apertures lengthwise of the tubes, transversely of the rod, and pull the stopper plugs therewith out of said one ends of the tubes.

5. The packaging system of claim 4 wherein said open apertures are sized and configured to maintain the assembly rod therewithin unless forcibly removed therefrom.

6. The packaging system of claim 5 wherein said open apertures are generally key-hole shaped to define hole portions, mouth portions and restricted portions therebetween, the hole portions being sized larger than the diameter of the rod, and the restricted portions being sized smaller than the diameter of the rod but allowing the rod to pass thereby outwardly of the tubes through the mouth portions of the apertures.

7. The packaging system of claim 6 wherein said tubes are fabricated of plastic material.

8. A packaging system for storing and handling electrical connector components, comprising:

a plurality of elongated component-containing tubes, each tube having an aperture near at least one end thereof and the aperture being open toward said one end;

an assembly rod adapted for passing through aligned apertures of a plurality of generally parallel juxtaposed tubes to hold the tubes in a generally stacked array; and a resilient stopper plug adapted for insertion into said one end of each tube to retain the components therein, each stopper plug including a hole through which the assembly rod passes to hold the stopper plugs in the tubes, whereby all of the stopper plugs are held in their respective tubes by the assembly rod and the assembly rod can be moved out of the open apertures in the tubes lengthwise of the tubes, transversely of the rod, and pull the stopper plugs therewith out of said one ends of the tubes.

9. The packaging system of claim 8 wherein said open apertures are sized and configured to maintain the assembly rod therewithin unless forcibly removed therefrom.

10. The packaging system of claim 9 wherein said open apertures are generally key-hole shaped to define hole portions, mouth portions and restricted portions therebetween, the hole portions being sized larger than the diameter of the rod, and the restricted portions being sized smaller than the diameter of the rod but allowing the rod to pass thereby outwardly of the tubes through the mouth portions of the apertures.

11. The packaging system of claim 10 wherein said tubes are fabricated of plastic material.

\* \* \* \* \*